United States Patent

Zook

Patent Number: 5,844,507
Date of Patent: Dec. 1, 1998

[54] RATE 16/17 ENDEC WITH INDEPENDENT HIGH/LOW BYTE DECODING

[75] Inventor: Christopher P. Zook, Longmont, Colo.

[73] Assignee: Cirrus Logic, Inc., Fremont, Calif.

[21] Appl. No.: 950,880

[22] Filed: Oct. 15, 1997

Related U.S. Application Data

[63] Continuation of Ser. No. 681,692, Jul. 29, 1996, Pat. No. 5,717,395.
[51] Int. Cl.⁶ .................................................... H03M 7/00
[52] U.S. Cl. ............................................ 341/50; 371/37.1
[58] Field of Search ................................. 341/50, 58, 59, 341/61; 371/37.1

[56] References Cited

U.S. PATENT DOCUMENTS 5,717,395   2/1998   Zook ......................................... 341/59
5,757,822   5/1998   Fisher et al. .

*Primary Examiner*—Brian K. Young
*Attorney, Agent, or Firm*—Howard H. Sheerin; Dan A. Shifrin

[57] ABSTRACT

A rate 16/17 ENDEC is disclosed which encodes 16 bit input data words into 17 bit codewords according to at least one predetermined code constraint, such as an RLL (d,k) constraint. The encoder encodes the high and low byte of the input data word using the same mapping circuitry which reduces its cost and complexity. The codewords are transferred through a communication channel, such as a computer disc storage device, and upon reception (or readback) the first 8 bits of the 17 bit codeword are decoded independent from the last 8 bits which prevents error propagation. That is, the first 8 bits of the codeword are decoded into a high byte of the decoded data word, and the last 8 bits of the codeword are decoded into a low byte of the decoded data word independent from one another. Thus, errors that occur in the received data sequence which affect only the first 8 bits of the codeword will not propagate to the decoded low byte, and errors affecting only the last 8 bits of the codeword will not propagate to the decoded high byte. Furthermore, the decoder uses the same mapping circuitry to decode the low and high byte of the output data words, thereby reducing its cost and complexity.

16 Claims, 11 Drawing Sheets

RATE 16/17 ENDEC WITH INDEPENDENT HIGH/LOW BYTE DECODING

This application is a continuation of application Ser. No. 08/681,692, filed Jul. 29, 1996, now U.S. Pat. No. 5,717,395.

FIELD OF INVENTION

The present invention relates to computer storage systems, including magnetic and optical disc drives, and particularly to an efficient 16/17 encoder/decoder (ENDEC) which decodes the high and low bytes of a codeword independent from one another, thereby preventing error propagation.

CROSS REFERENCE TO RELATED APPLICATIONS AND PATENTS

This application is related to other co-pending U.S. patent applications, namely application Ser. No. 08/341,251 entitled "Sampled Amplitude Read Channel Comprising Sample Estimation Equalization, Defect Scanning, Channel Quality, Digital Servo Demodulation, PID Filter for Timing Recovery, and DC Offset Control," 08/313,491 entitled "Improved Timing Recovery For Synchronous Partial Response Recording," and 08/533,797 entitled "Improved Fault Tolerant Sync Mark Detector For Sampled Amplitude Magnetic Recording." This application is also related to several U.S. patents, namely U.S. Pat. No. 5,359,631 entitled "Timing Recovery Circuit for Synchronous Waveform Sampling," U.S. Pat. No. 5,291,499 entitled "Method and Apparatus for Reduced-Complexity Viterbi-Type Sequence Detectors," U.S. Pat. No. 5,297,184 entitled "Gain Control Circuit for Synchronous Waveform Sampling," U.S. Pat. No. 5,329,554 entitled "Digital Pulse Detector," and U.S. Pat. No. 5,424,881 entitled "Synchronous Read Channel." All of the above-named patent applications and patents are assigned to the same entity, and all are incorporated herein by reference.

BACKGROUND OF THE INVENTION

In magnetic disc storage systems for digital computers, a write head (typically an inductive coil type) writes magnetic flux transitions onto the surface of a magnetic disc in order to record a sequence of binary "1"s and "0"s. To read this recorded binary data, a read head, positioned in close proximity to the rotating magnetic disc, detects the magnetic flux transitions and generates corresponding pulses in an analog read signal. These pulses are then detected and decoded by a read channel into an estimated binary sequence. In the absence of errors, the estimated binary sequence equals the recorded binary sequence; however, there are many factors that can reduce the signal-to-noise ratio of the analog read signal which may induce errors in the estimated binary sequence.

An error in the pulse detection process is most often caused by intersymbol interference (ISI) and/or channel noise. Conventionally, read channels were implemented with a simple analog peak detector for detecting the peaks in the analog read signal. However, the accuracy of an analog peak detector degrades quickly as ISI and channel noise increase. To alleviate this undesirable effect, more recent storage systems employ a sampled amplitude read channel comprising sophisticated digital signal processing circuitry which takes into account the effect of ISI and channel noise in the detection algorithm.

To this end, sampled amplitude read channels comprise a sampling device which samples the analog read signal to generate a sequence of discrete time sample values, and timing recovery which synchronizes the sample values to the baud rate (code bit rate). Then, a sequence detector evaluates the synchronous sample values in context in order to select a most likely sequence for the estimated binary data. There are several well known discrete time sequence detection methods including maximum likelihood sequence detection (MLSD), partial response (PR) with Viterbi detection (an approximation of MLSD), decision-feedback equalization (DFE), enhanced decision-feedback equalization (EDFE), and fixed-delay tree-search with decision-feedback (FDTS/DF).

Both conventional peak detection and more recent sampled amplitude read channels normally encode the user data according to a constraint which limits the number of consecutive "0" bits so that timing recovery and gain control operate properly. In addition, the user data may be encoded to restrict the spacing between consecutive "1" bits, that is, to ensure that a minimum number of "0" bits occur between "1" bits. The latter constraint reduces the effect of ISI in analog peak detect read channels, and it reduces the cost and complexity of the sequence detector as well as increases the minimum distance error event in discrete time read channels. Thus, the user data is encoded according to a run-length limited (RLL) code commonly designated by RLL (d,k), where d represents the maximum number of consecutive "0" bits and k represents the minimum number of "0" bits between consecutive "1" bits.

RLL encoding reduces the efficiency of the storage system due to the overhead associated with the encoding process (also known as the rate loss). Introducing an RLL constraint necessarily requires encoding m bits of user data into an n bit codeword where m<n. Conventionally, designers have employed a rate 8/9 ENDEC meaning that 8 bits of user data are encoded into a 9 bit codeword which satisfies the desired RLL constraint. An example of an 8/9 ENDEC employed in a sampled amplitude read channel is disclosed in U.S. Pat. No. 5,422,760 entitled "DISK DRIVE METHOD USING ZONED DATA RECORDING AND PRML SAMPLING DATA DETECTION WITH DIGITAL ADAPTIVE EQUALIZATION".

Higher rate ENDECs have not been employed for at least two reasons:

1. a higher rate ENDEC, such as rate 16/17, is prohibitively complex to implement cost effectively; and
2. errors in the detected sequence upon read back will propagate across multiple bytes in the decoded output. As for the first drawback, there is at least one prior art example of a higher rate ENDEC which addresses this issue. In IBM Technical Disclosure Bulletin, Vol. 31, No. 8, January 1989, there is disclosed a rate 16/17 ENDEC which takes advantage of symmetry in the code constraints with respect to the bit positions in the codewords which significantly reduces the encoding/decoding logic. Still, the rate 16/17 ENDEC disclosed in that paper does not address the second problem stated above; that is, it will not prevent error propagation in the decoding process. If an error occurs in the low byte of a codeword, the decoder will propagate that error to the high byte of the decoded output. Similarly, errors in the high byte of the codeword will propagate to the low byte of the decoded data word during the decoding process.

There is, therefore, a need for a rate 16/17 ENDEC which is not prohibitively complex to implement and which prevents error propagation in the decoded output.

SUMMARY OF THE INVENTION

A rate 16/17 ENDEC is disclosed which encodes 16 bit input data words into 17 bit codewords according to at least one predetermined code constraint, such as an RLL (d,k) constraint. The encoder encodes the high and low byte of the input data word using the same mapping circuitry, which reduces its cost and complexity. The codewords are transferred through a communication channel, such as a computer disc storage device, and upon reception (or readback) the first 8 bits of the 17 bit codeword are decoded independent from the last 8 bits which prevents error propagation. That is, the first 8 bits of the codeword are decoded into a high byte of the decoded data word, and the last 8 bits of the codeword are decoded into a low byte of the decoded data word independent from one another. Thus, errors that occur in the received data sequence which affect only the first 8 bits of the codeword will not propagate to the decoded low byte, and errors affecting only the last 8 bits of the codeword will not propagate to the decoded high byte. Furthermore, the decoder uses the same mapping circuitry to decode the low and high byte of the output data words, thereby reducing its complexity and cost.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

CONVENTIONAL SAMPLED AMPLITUDE READ CHANNEL

Figure 1:
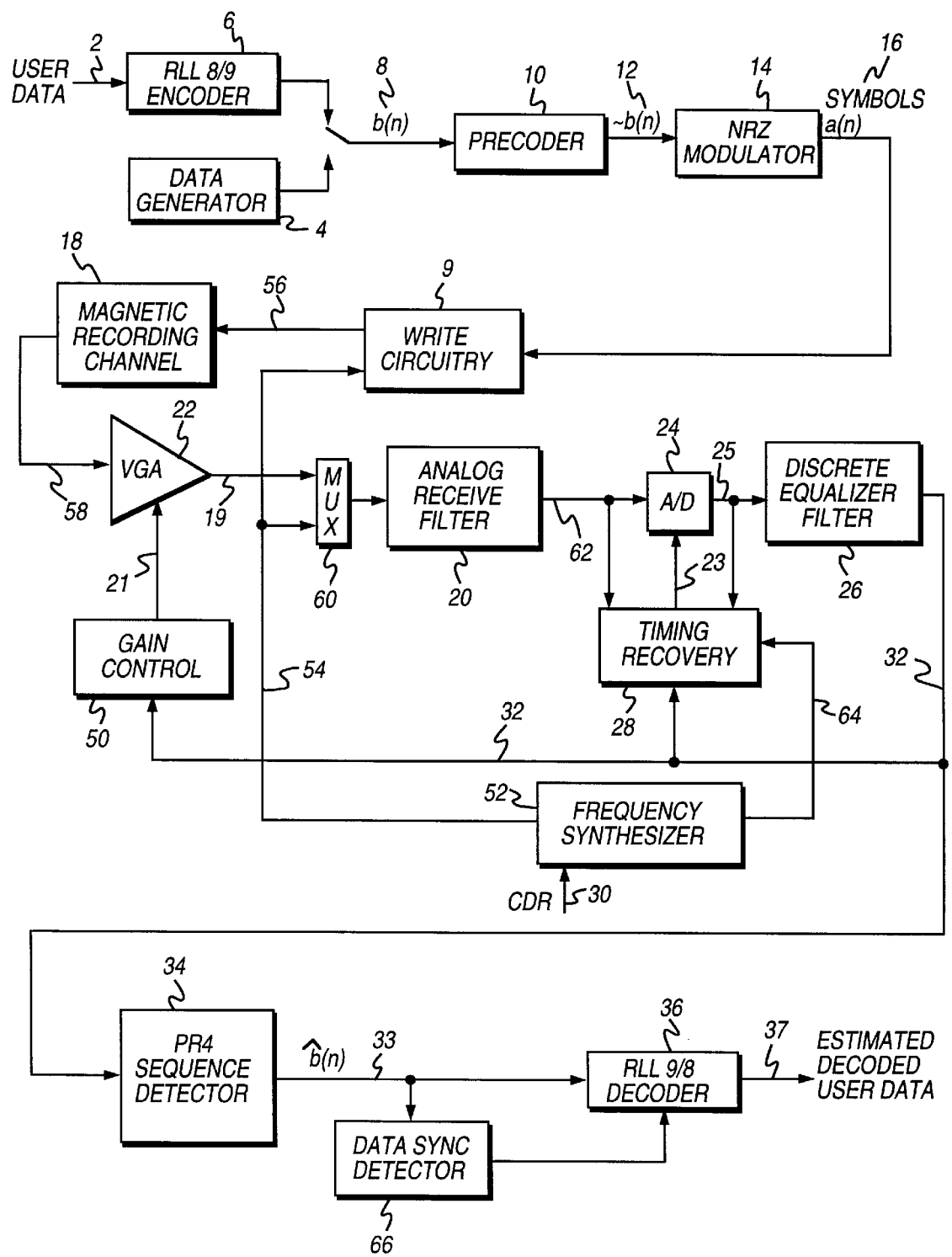
FIG. 1 is a block diagram of a conventional sampled amplitude read channel.

Referring now to FIG. 1, shown is a detailed block diagram of a conventional sampled amplitude read channel. During a write operation, either user data 2 or preamble data from a data generator 4 (for example 2T preamble data) is written onto the media. An RLL encoder 6 encodes the user data 2 into a binary sequence b(n) 8 according to an RLL constraint. A $1/(1+D^2)$ precoder 10 precodes the binary sequence b(n) 8 in order to compensate for the transfer function of the recording channel 18 and equalizer filters and to prevent bit error propagation. The output of the precoder 10 (precoded sequence ~b(n) 12) is converted into symbols a(n) 16 by a NRZ modulator 14 which modulates ~b(N)=0 into a(N)=−1, and ~b(N)=1 into a(N)=+1. Write circuitry 9, responsive to the symbols a(n) 16, modulates the current in the recording head coil at the baud rate 1/T to record the binary sequence onto the media. A frequency synthesizer 52 provides a baud rate write clock 54 to the write circuitry 9 and is adjusted by a channel data rate signal (CDR) 30 according to the zone the recording head is over.

When reading the recorded binary sequence from the media, timing recovery 28 first locks to the write frequency by selecting, as the input to the read channel, the write clock 54 through a multiplexer 60. Once locked to the write frequency, the multiplexer 60 selects the signal 19 from the read head as the input to the read channel in order to acquire an acquisition preamble recorded on the disc prior to the recorded user data. A variable gain amplifier 22 adjusts the amplitude of the analog read signal 58, and an analog filter 20 provides initial equalization toward the desired response as well as attenuating aliasing noise. A sampling device 24 samples the analog read signal 62 from the analog filter 20, and a discrete time equalizer filter 26 provides further equalization of the sample values 25 toward the desired response. In partial response recording, for example, the desired response is often selected from Table 1.

After equalization, the equalized sample values 32 are applied to a decision directed gain control 50 and timing recovery 28 circuit for adjusting the amplitude of the read signal 58 and the frequency and phase of the sampling device 24, respectively. Timing recovery adjusts the frequency of sampling device 24 over line 23 in order to synchronize the equalized samples 32 to the baud rate. Frequency synthesizer 52 provides a course center frequency setting to the timing recovery circuit 28 over line 64 in order to center the timing recovery frequency over temperature, voltage, and process variations. The channel data rate (CDR) 30 signal adjusts a frequency range of the synthesizer 52 according to the data rate for the current zone. Gain control 50 adjusts the gain of variable gain amplifier 22 over line 21 in order to match the magnitude of the channel's frequency response to the desired partial response.

The equalized samples 32 are also sent to a PR4 sequence detector 34 (typically implemented as a pair of interleaved sliding threshold detectors) which detects an estimated binary sequence ^b(n) 33 from the sample values. An RLL decoder 36 decodes the estimated binary sequence ^b(n) 33 from the PR4 sequence detector 34 into estimated user data 37. A data sync detector 66 detects the sync mark 70 (shown in FIG. 2B) in the data sector 15 in order to frame operation of the RLL decoder 36. In the absence of errors, the estimated binary sequence ^b(n) 33 matches the recorded binary sequence b(n) 8, and the decoded user data 37 matches the recorded user data 2.

DATA FORMAT

Figure 2A:
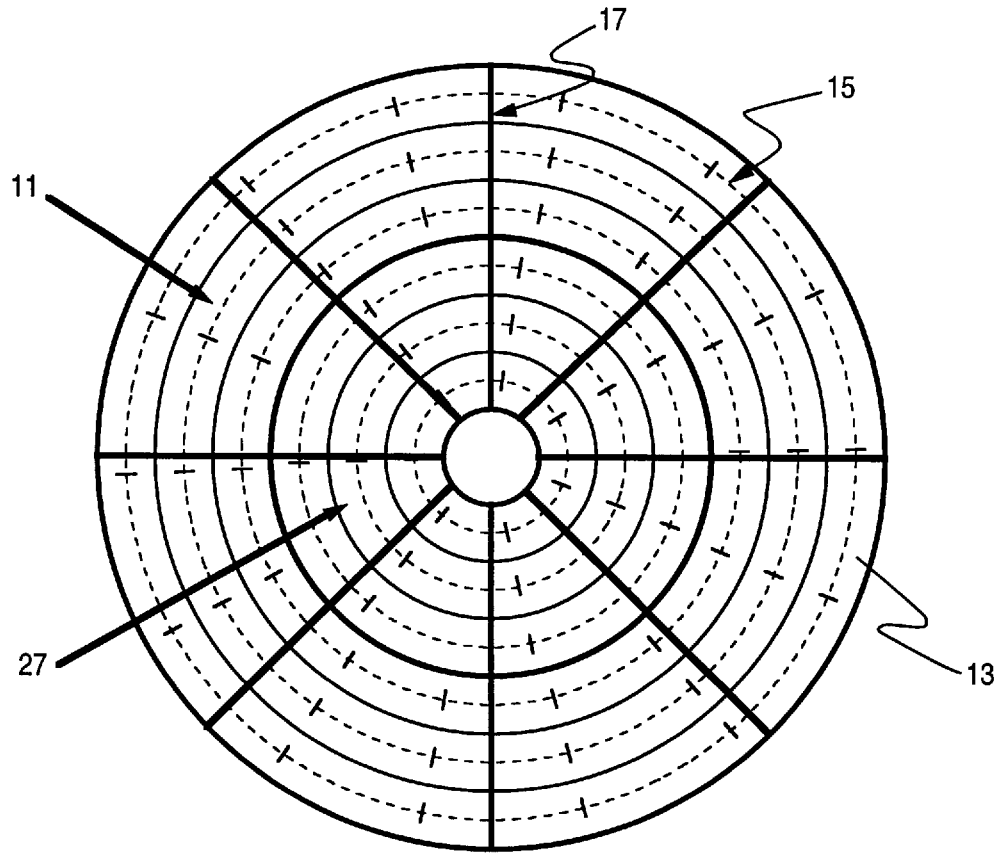
FIG. 2A shows an exemplary data format for a magnetic disc storage medium comprising a plurality of concentric data tracks having a plurality of user data sectors and embedded servo data sectors.

FIG. 2A shows an exemplary data format of a magnetic media comprising a series of concentric data tracks 13 wherein each data track 13 comprises a plurality of sectors 15 with embedded servo wedges 17. A servo controller (not shown) processes the servo data in the servo wedges 17 and, in response thereto, positions the read/write head over a desired track. Additionally, the servo controller processes servo bursts within the servo wedges 17 to keep the head aligned over a centerline of the desired track while writing and reading data. The servo wedges 17 may be detected by a simple discrete time pulse detector or by the discrete time sequence detector 34. If the sequence detector 34 detects the servo data, then the format of the servo wedges 17 includes a preamble and a sync mark, similar to the user data sectors 15.

Figure 2B:
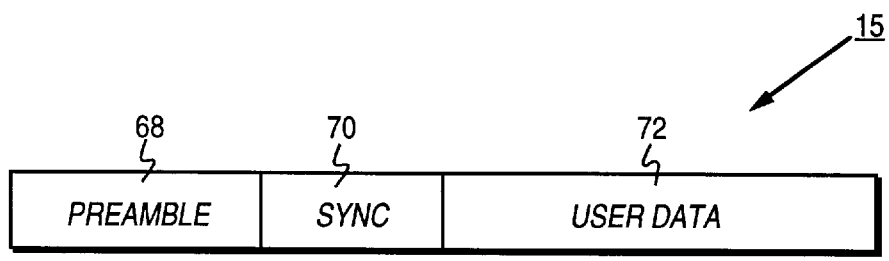
FIG. 2B shows an exemplary format of a user data sector.

FIG. 2B shows the format of a user data sector 15 comprising an acquisition preamble 68, a sync mark 70, and data 72. Timing recovery processes the acquisition preamble 68 to acquire the correct sampling frequency and phase before reading the data 72, and the sync mark 70 demarks the beginning of the data 72.

To increase the overall storage density, the disc is partitioned into an outer zone 11 comprising fourteen data sectors per track, and an inner zone 27 comprising seven data sectors per track. In practice, the disc is actually partitioned into several zones with a different number of sectors in each zone, and the data recorded and detected at a different data rate in each zone.

CONVENTIONAL TIMING RECOVERY

Figure 3A:
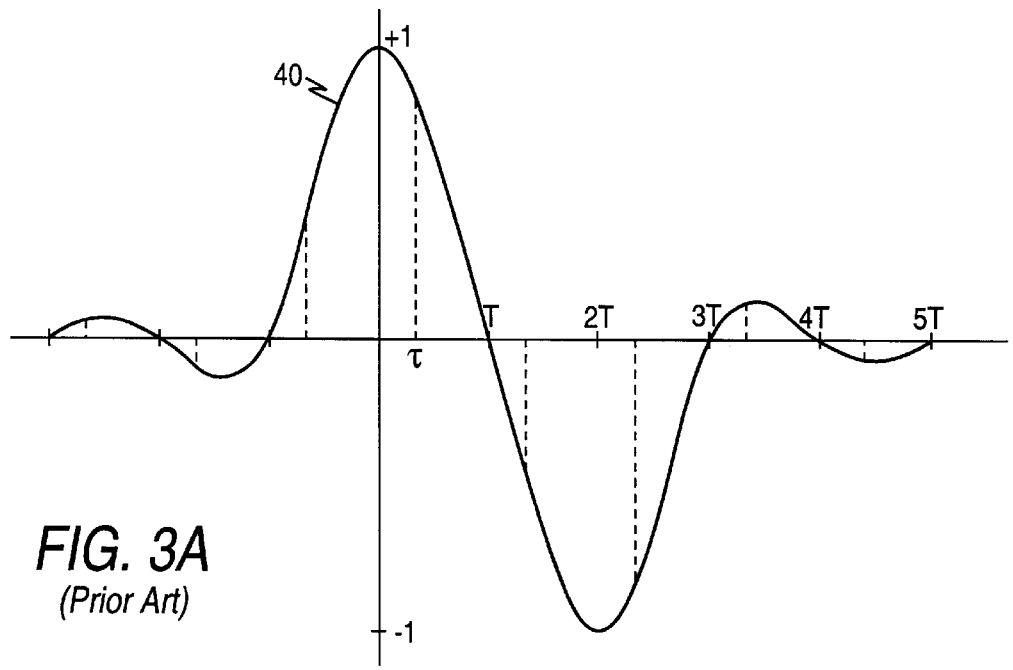
FIG. 3A shows a sampled dipulse response of a PR4 read channel with a timing phase error $\tau$.
Figure 3B:
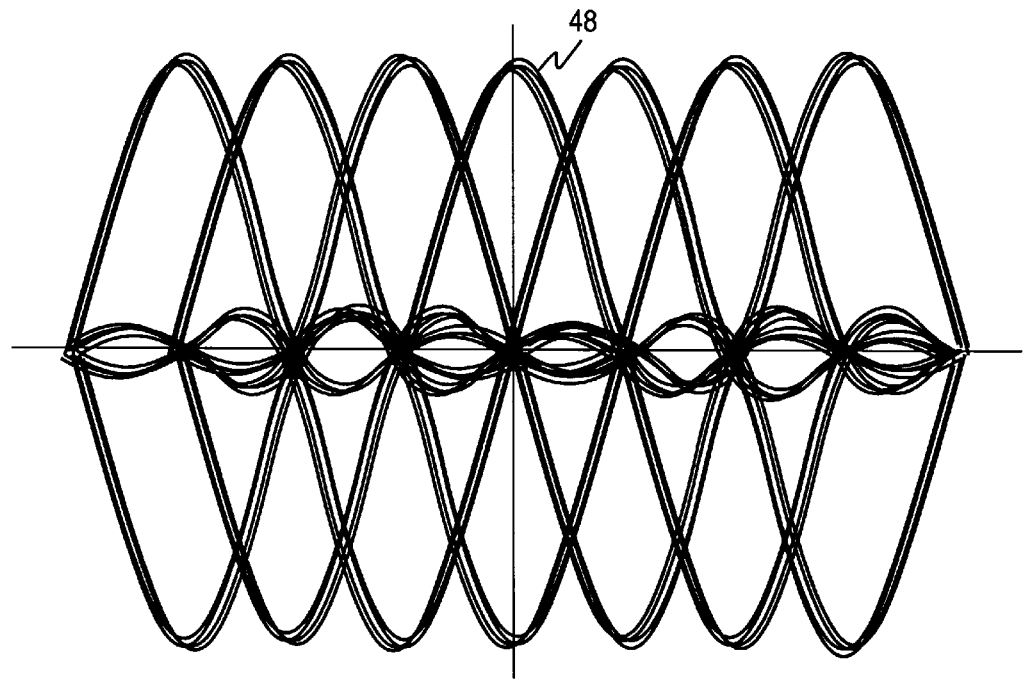
FIG. 3B shows the three level "eye-diagram" for a PR4 read channel.

FIG. 3A shows a PR4 dipulse response h(t) 40 of the combined recording channel q(t) 42, analog filter f(t) 44, and discrete time equalizer c(n) 46. If the sampling frequency and phase are correct ($\tau=0$), the equalized sample sequence will be $\{0, 0, +1, 0 -1, 0, 0, \ldots \}$; whereas a phase error ($\tau!=0$) introduces errors into the equalized sample sequence. For example, the sample sequence with a phase error may be $\{+0.1, -0.2, +0.4, +0.8, -0.4, -0.8, +0.2, -0.1, \ldots \}$. These errors are amplified in the presence of intersymbol interference (ISI). As shown in FIG. 3B, the optimum sampling instance occurs at the opening 48 of the eye diagram where ISI is minimum. In an ideal PR4 recording channel, the optimum sampling phase is $\tau=0$, that is, when the read signal samples are synchronized to the baud rate.

Figure 4:
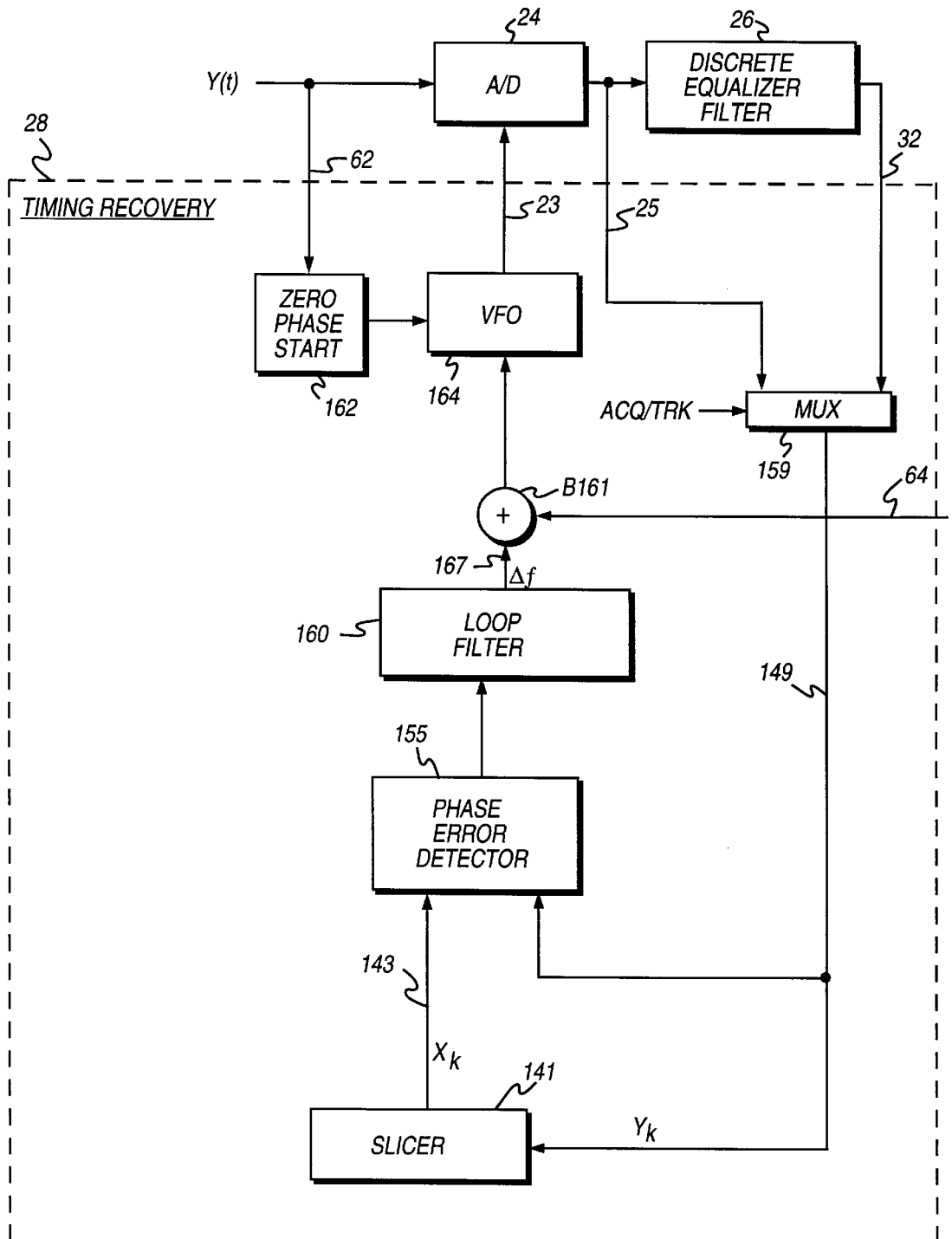
FIG. 4 is a detailed block diagram of a conventional timing recovery circuit for a PR4 read channel comprising a phase error estimator for use in a phase-locked-loop.

In the conventional PR4 read channel of FIG. 1, the timing recovery circuit 28 synchronizes the read signal sample values to the baud rate by synchronizing a sampling device. FIG. 4 shows an overview of a conventional sampling timing recovery circuit 28. A variable frequency oscillator (VFO) 164 controls the sampling clock 23 of a sampling device 24 which is typically an analog-to-digital converter (A/D) in digital read channels. A multiplexer 159 selects the unequalized sample values 25 during acquisition and the equalized sample values 32 during tracking, thereby removing the discrete equalizer filter 26 from the timing loop during acquisition in order to avoid its associated latency. A phase error estimator 155 generates a phase error estimate in response to the sample values received over line 149 and estimated sample values $X_k$ from a sample value estimator 141, such as a slicer, over line 143. A loop filter 160 filters the phase error to generate a frequency offset $\Delta f$ 167 that settles to a value proportional to a frequency difference between the sampling clock 23 and the baud rate. The frequency offset $\Delta f$ 167, together with the center frequency control signal 64 from the frequency synthesizer 52, adjust the sampling clock 23 at the output of the VFO 164 in order to synchronize the sampling to the baud rate.

A zero phase start 162 circuit suspends operation of the VFO 164 at the beginning of acquisition in order to minimize the initial phase error between the sampling clock 23 and the read signal 62. This is achieved by disabling the VFO 164, detecting a zero crossing in the analog read signal 62, and re-enabling the VFO 164 after a predetermined delay between the detected zero crossing and the first baud rate sample.

The phase error estimator 155 of FIG. 4 operates according to the above stochastic gradient equation (2), $$\Delta\Theta = Y_k \cdot (X_{k-1}) + Y_{k-1} \cdot (X_k) \tag{2}$$

where $Y_k$ are the actual sample values 149 and $X_k$ are the estimated sample values 143 at the output of slicer 141.

Figure 5:
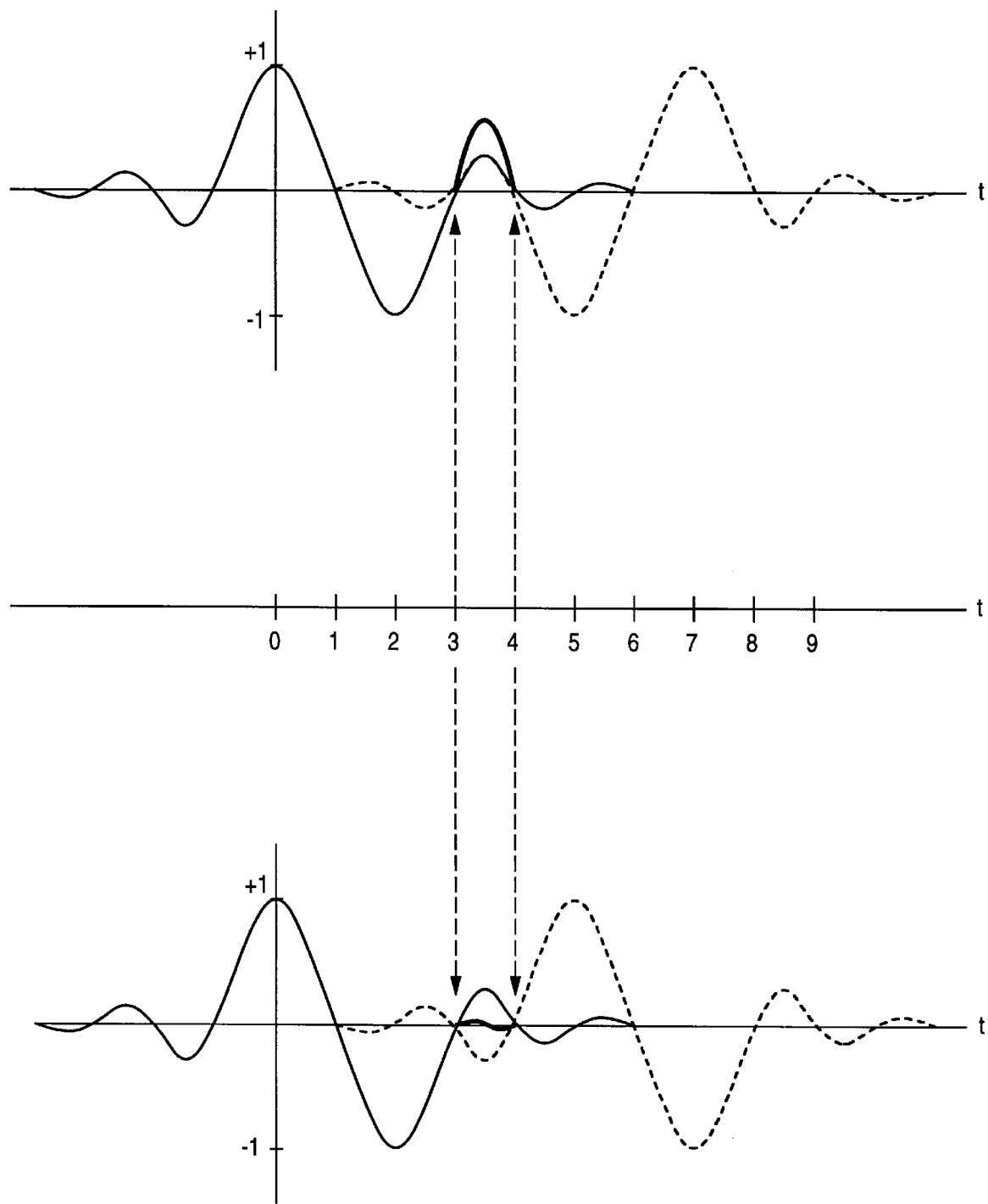
FIG. 5 illustrates two analog read waveforms that can result from the same user data input sequence when using a $1/(1+D^2)$ precoder in a conventional PR4 read channel.

The above equation for estimating the phase error $\Delta\Theta$ is based on approximating the slope of the pulses in the analog read signal at the sample instances. If the slope is not well defined, then the phase error estimate will degrade. In the conventional PR4 read channel of FIG. 1, which uses a $1/(1+D^2)$ precoder 10, the slope of the analog pulses representing a data symbol may be ill defined depending on the state of the precoder 10 when the symbol was written to the disc. This is illustrated in FIG. 5 which shows two possible analog read signals for the same data symbol written to the disc in a conventional PR4 read channel (i.e., two possible analog read signals depending on the initial state of the $1/(1+D^2)$ precoder). Between the sample instances 3 and 4, the slope of the analog read signal in the upper waveform is much better defined than the slope of the analog read signal in the lower waveform. As can be seen, this is due to the differing effect of intersymbol interference (ISI) depending on the polarity of the second dipulse response (shown as a dashed line). Thus, the upper waveform provides a much better slope approximation for the phase error estimate of equation (2) than does the lower waveform.

IMPROVED SAMPLED AMPLITUDE CHANNEL

Figure 6:
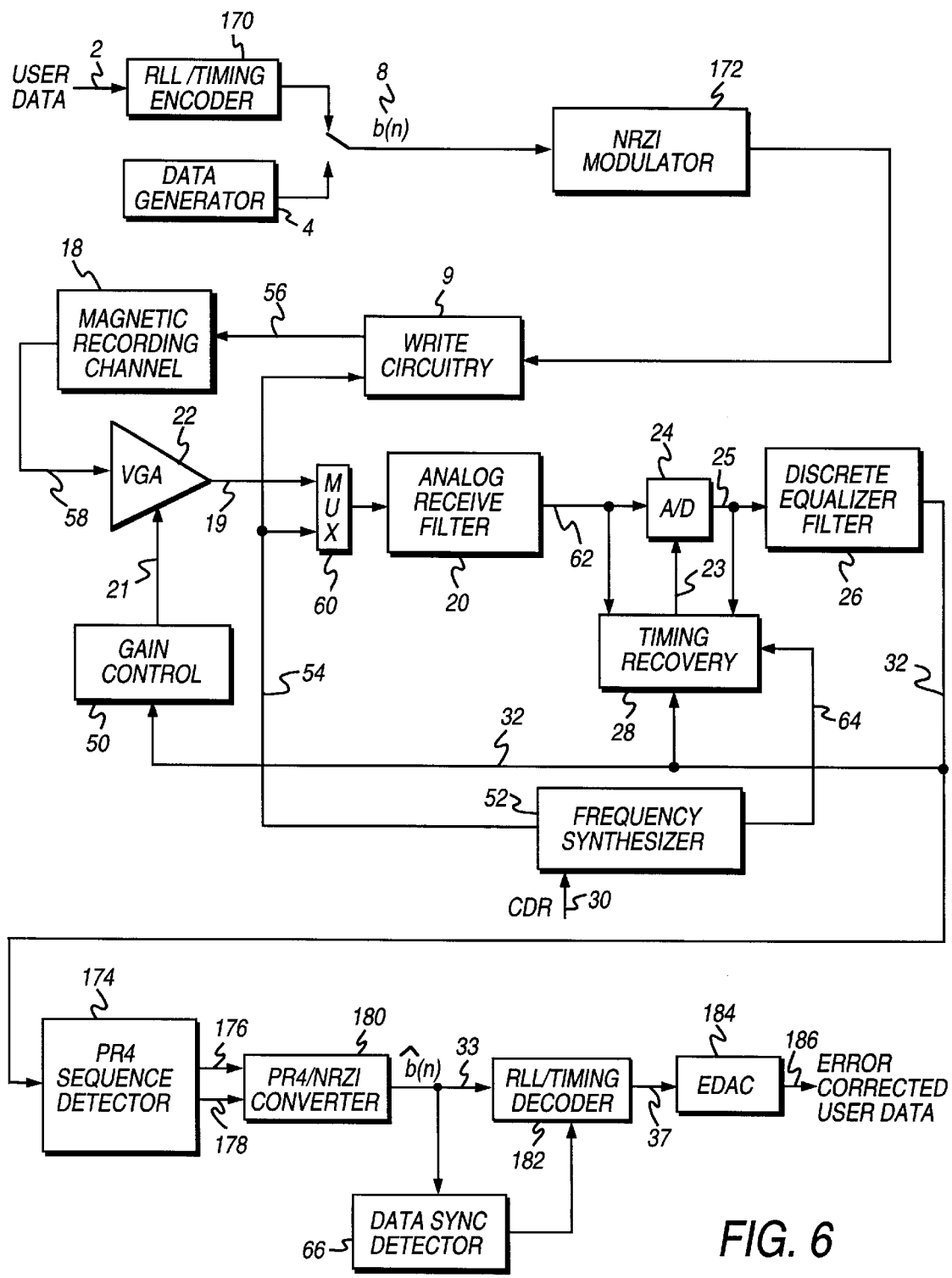
FIG. 6 is a block diagram of the improved sampled amplitude read channel of the present invention.

FIG. 6 shows the improved sampled amplitude read channel of the present invention. To facilitate the encoding scheme, the conventional RLL encoder 6 of FIG. 1 is replaced with an RLL/timing encoder 170 of the present invention for improving the timing recovery phase error estimate as described below. Furthermore, the $1/(1+D^2)$ precoder 10 and NRZ modulator 14 of FIG. 1 are not used. Instead, the encoded data symbols b(n) 8 are written directly to the magnetic disc using an NRZI modulator 172. That is, for a "1" bit in the data symbols b(n) 8, the NRZI modulator 172 toggles the write current (from positive to negative or vise versa), and for a "0" bit it leaves the write current unchanged.

When reading the recorded binary data, the read channel of FIG. 6 operates similar to the prior art read channel of FIG. 1 described above. A Viterbi type PR4 sequence detector 174, preferably implemented as two interleaved, sliding threshold detectors, processes the even and odd interleaves of the equalized sample values 32 similar to the detector 34 of FIG. 1. However, since the conventional 1/(1+D$^2$) precoder 10 is not used, the PR4 sequence detector 174 outputs a sign bit 178 for each flux transition corresponding to a "1" detected in the data sequence 176 (i.e., the sequence detector 174 outputs signed PR4 data). A sign bit 178 is associated with each "1" and "0" bit output by the sequence detector 174 in each interleave. For example, if a positive transition is detected in the even interleave, then the sequence detector 174 outputs a "+1" followed by "+0" values until a negative transition is detected in the even interleave. A NRZI converter 180 implemented with combinatorial logic according to Table 2, converts the signed PR4 data into an estimated signed NRZI sequence (SNRZI) ˆb(n) 33, and thus back into the representation of the data symbols b(n) 8 written to the disc.

Figure 7A:
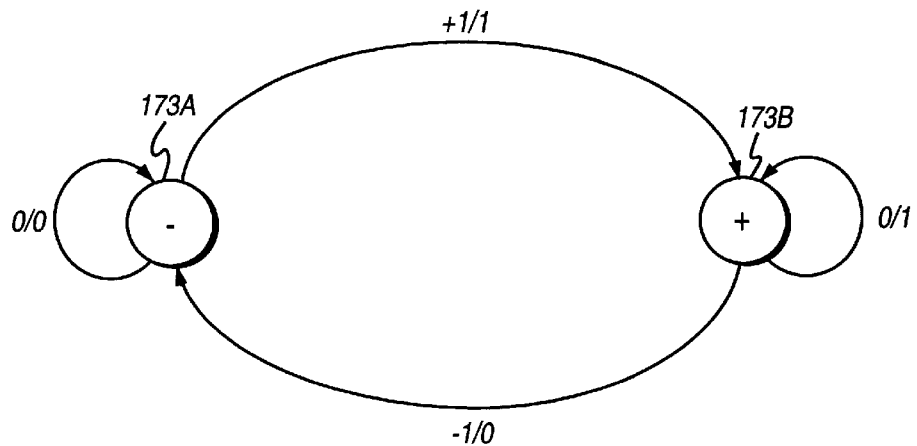
FIG. 7A is a NRZ state transition diagram for a dicode sequence.
Figure 7B:
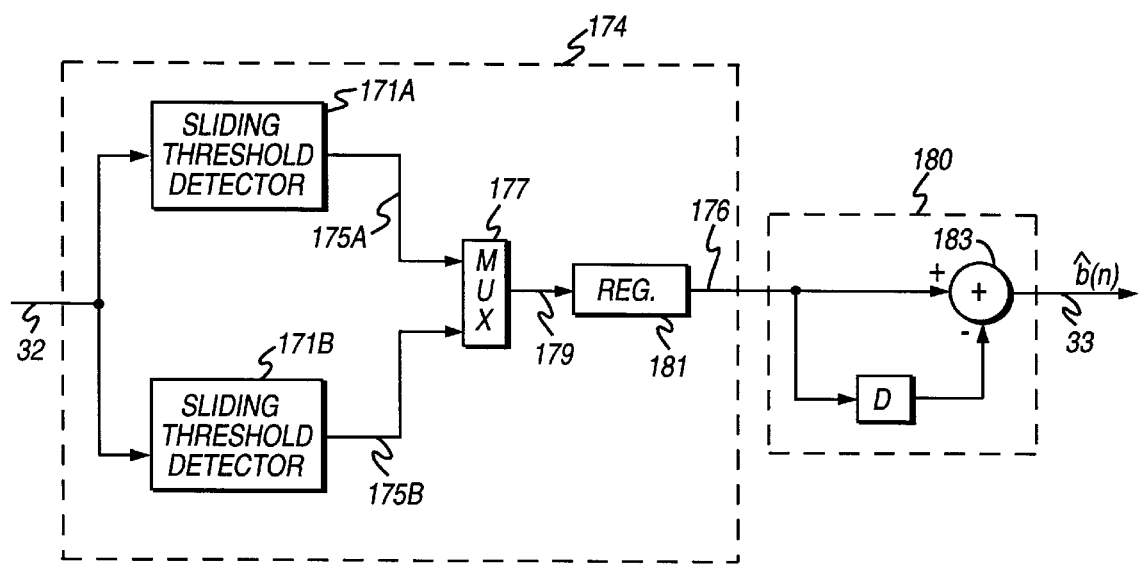
FIG. 7B shows an implementation of the sliding threshold Viterbi sequence detectors which operate according to the state transition diagram of FIG. 7A.

An alternative embodiment for the PR4 sequence detector 174 and NRZI converter 180 is shown in FIG. 7A and 7B. In this embodiment, the sliding threshold Viterbi detectors 171A and 171B process the even and odd interleave of the equalized sample values 32, respectively, but they do not output a sign bit as described above 178. Instead, each detector is modified to operate according to a NRZ state transition diagram shown in FIG. 7A (rather than a conventional NRZI transition diagram). The two states 173A and 173B represent the state of the NRZ sequence, that is, the polarity of the flux. The transition branches are labeled with a designator ±S/X where ±S represent the signal samples and X represents the binary NRZ sequence. The NRZ sequences 175A and 175B output by the detectors 171A and 171B are combined at multiplexer 177, to form a complete NRZ sequence 179 shifted into a shift register 181. The output of the shift 176 register is then converted into a signed NRZI sequence ˆb(n) 33 by passing the NRZ sequence 179 through a 1-D filter 180 where the adder 183 in the filter is base ten (not an XOR gate).

The estimated NRZI sequence ˆb(n) 33 is decoded by RLL/timing decoder 182 according to the inverse mapping of the RLL/timing encoder 170 in order to generate an estimated user data sequence 37. An error detection and correction (EDAC) circuit 184 detects and corrects errors in the estimated user data sequence, thereby generating a corrected user data sequence 186 transferred to the host computer.

As discussed above, the conventional 1/(1+D$^2$) precoder 10 of FIG. 1 prevents bit error propagation which is necessary for storage systems that employ a bit-oriented error detection and correction code, such as a Fire code. The present invention addresses the bit error propagation problem through a unique encoder 170 and decoder 184 implementation as discussed below. The EDAC circuit 184 operates according to any well known byte-oriented error correcting code, such as a Reed-Solomon code, the details of which are well known to those skilled in the art.

ENCODER

An aspect of the present invention is to encode 170 the data in order to improve the phase error estimate in the timing recovery circuit 28 of FIG. 6 by controlling the flux transitions written to the disc, thereby controlling the slope of the resulting analog pulses at the sample instances during readback. It is possible to control the flux transitions, in the present invention, because the 1/(1+D$^2$) precoder 10 found in the conventional PR4 read channel of FIG. 1 is not used as shown in the PR4 read channel of FIG. 6. In other words, for a given input sequence of data symbols, the resulting analog read signal can be determined without ambiguity, and it can be evaluated according to the quality of the resulting phase error estimate.

Thus, in the present invention, each user data symbol is graded according to the quality of the resulting phase error estimate it will generate. If the grade for a data symbol exceeds a predetermined threshold, indicating that the resulting phase error estimate will be sufficiently accurate, then the symbol is written to the disc unmodified. However, if the grade is below the threshold, then the data symbol is encoded into a new symbol that will improve the accuracy of the phase error estimate.

Figure 8A:
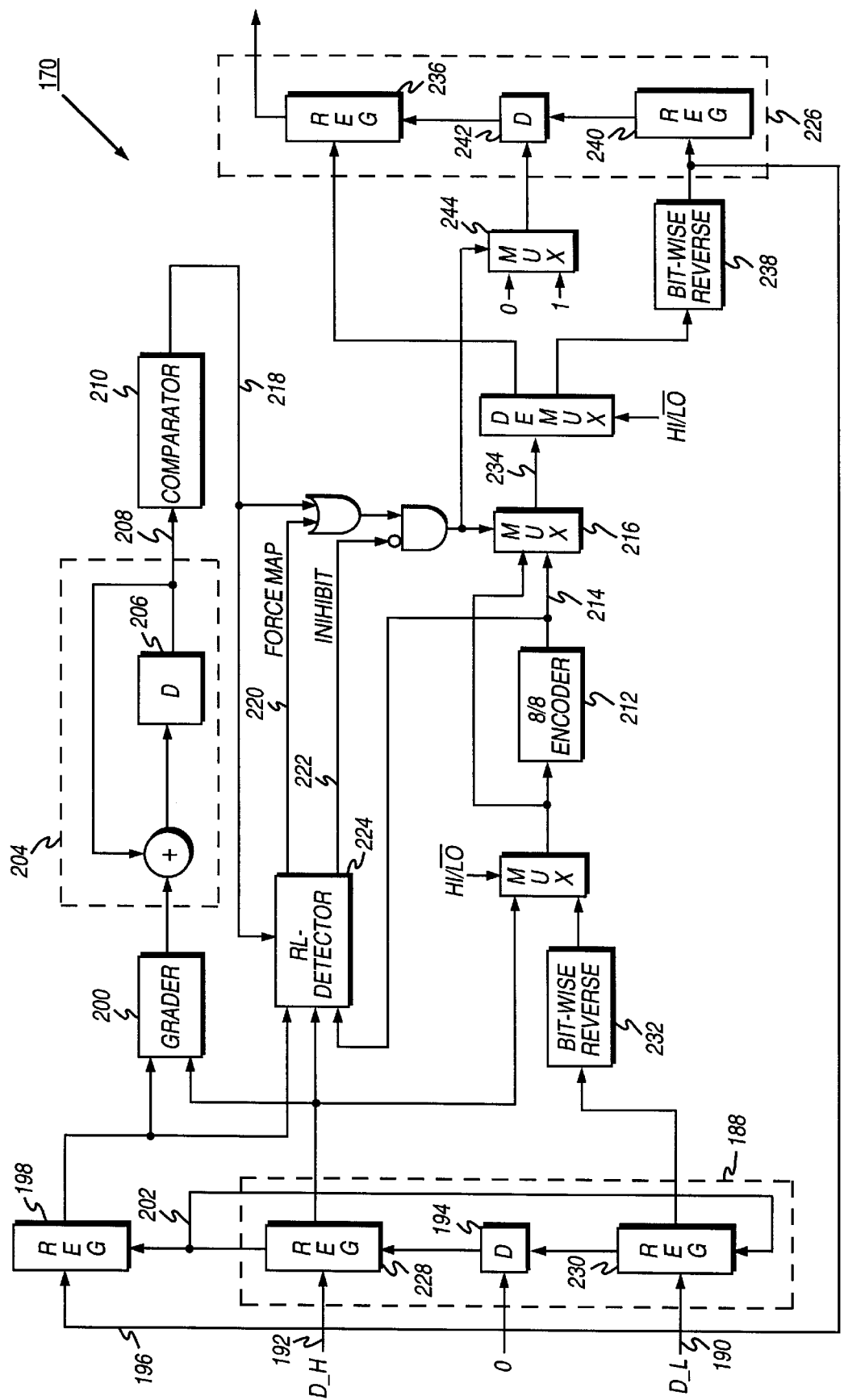
FIG. 8A shows details of a 16/17 encoder for encoding user data in order to optimize operation of the phase error estimator of FIG. 4.

A detailed block diagram of the RLL/timing encoder 170 of the present invention is shown in FIG. 8A. The user data 2 is processed 16 bits at a time by loading a 17 bit shift register 188 with a low byte 190 and a high byte 192. The middle bit 194 of the shift register is set to "0" indicating that the codeword is initially unmapped. The low byte 196 of the previous codeword is loaded into register 198 so that the current codeword can be graded, as will be understood from the following discussion.

A grader 200 grades each bit in the current codeword as it shifts out of the shift register 188 on line 202. The bits of the codeword are shifted back into the register 188 over line 202 after grading. The bit grades are accumulated 204 in register 206, and the overall codeword grade 208 is compared to a predetermined threshold at comparator 210. Depending on whether or not the threshold is exceeded, the current codeword, which has been shifted back into register 188, is now encoded.

In the preferred embodiment, the threshold in comparator 210 is 18. If the codeword grade 208 exceeds 18, then it is not mapped because it will already generate an accurate phase error estimate. Conversely, if the codeword grade 208 is below 18, then the high 192 byte and low byte 190 are mapped independently by an 8/8 encoder 212, which operates according to Table 4, into a new codeword 214 that will provide a better phase error estimate. The selective mapping is implemented through a multiplexer 216 as controlled by the output 218 of the grade comparator 210 and a FORCE MAP 220 and INHIBIT 222 signal, the latter signals described in detail below.

The bit grade for each bit in the codeword is generated according to Table 3. For the bit sequences which provide the best phase error estimates, Table 3 shows a grade value associated with a corresponding bit being graded. That is, the grader 200 in FIG. 8A evaluates the bit being graded 202 in context with the surrounding bits. If there is a match between the input sequence and one of the sequences in Table 3, then the grader 200 outputs the corresponding grade value for the graded bit; otherwise, the grader 200 outputs a grade of zero.

Consider, for example, a previous codeword and a current codeword,

| previous codeword | current codeword |
|---|---|
| ...XXX01101 | 1100101100111011 |

The grader 200 of FIG. 8A would output a bit grade of 2 for the first bit of the current codeword because it is the third bit in the sequence 01110 in row 6 of the first column in Table 3. A grade of 2 would be output for the second bit because it is the fourth bit in the sequence 01110 in row 6 of the first column, a grade of 0 would be output for the third bit because it does not match any of the rows in Table 3, a grade of 2 would be assigned to the fourth bit because it matches the sequence in row 1, etc.

A match is found only if the sequence in Table 3 does not extend beyond the current codeword. For example, when grading bit 16 of the current codeword, only the last column in row 3 and the first column of rows 10 and 11 of Table 3 are used since all other sequences will extend out beyond the end of the current codeword. Furthermore, the last row in Table 3 is used to grade bits 13–16 of the current codeword in the event that no other matches are found.

In addition to encoding the user data to optimize the accuracy of the phase error estimate for timing recovery, the RLL/timing encoder 170 must also ensure the codewords have the following constraints:

1. a constraint to ensure that, upon readback, a maximum of k zero samples occur between consecutive non-zero samples in the read signal sample values (the preferred value for k is 14); and
2. a constraint to ensure that, upon readback, a non-zero sample value will occur in both the even and odd interleaves in the read signal sample values within every sequence of 17 bits beginning with the bit following the middle bit of a current codeword and ending with the middle bit of the following codeword.

The above first constraint is similar to the well known k constraint of an RLL (d,k) code; that is, it ensures proper operation of timing recovery 28 for a PR4 read channel since the phase error estimate is computed only when a non-zero sample value is processed at the output of the equalizer 26. The above second constraint ensures path closure in the PR4 sequence detector 34 (i.e., it codes out quasi-catastrophic error events), and it ensures that any minimum distance error event generated by the PR4 sequence detector 34 will not effect more than three codeword bytes, the benefits of which will be better understood after reading the description of the EDAC circuit 184 provided below.

In FIG. 8A, a run-length detector 224 evaluates the high byte 228 of the current codeword 188, the prepended low byte 198 of the previous codeword 226, and the mapped codeword 214 to determine whether the above two constraints are satisfied. In order to check for the above constraints, the input sequence must be converted to a PR4 format by passing the sequence through a 1+D filter (not shown). If the current codeword is unmapped and the above run-length constraints are violated, then the run-length detector 224 asserts a FORCE MAP 220 signal which forces the codeword to be mapped at 5 multiplexer 216. The codeword set for mapping, as shown in Table 4, guarantees that if the FORCE MAP 220 signal is activated, then the mapped codeword will satisfy the above constraints.

If the current codeword is mapped 212 into a new codeword 214 in order to provide a better phase error estimate, then the run-length detector 224 checks the mapped codeword 214 and the prepended low byte 198 of the previous codeword to check whether the above two constraints are satisfied. If the mapped codeword 214 violates the above constraints, then the run-length detector 224 asserts an INHIBIT signal 222 which inhibits the mapping at multiplexer 216. The codeword set for mapping in Table 4 guarantees that if the INHIBIT signal 222 is activated, then the unmapped codeword will satisfy the above constraints.

The 8/8 encoder 212 generates the mapped codeword 214 according to Table 4 as follows. First, it maps the high byte 192 of the current codeword stored in register 228 according to Table 4. Then, the low byte 190 of the current codeword stored in register 230 is bit-wise reversed 232 and encoded by the 8/8 encoder 212 using the same mapping as the high byte 228 (i.e., using Table 4). The mapped/unmapped codeword 234 at the output of multiplexer 216 is loaded into a 17-bit shift register 226. The high byte is loaded into register 236, and the low byte is bit-wise reversed 238 and loaded into register 240. The middle bit 242 of the shift register 226 is loaded through multiplexer 244 with a "1" if the codeword is mapped, and it is loaded with a "0" if the codeword is unmapped. The middle bit 242 is used by the decoder 182 of FIG. 6 to decode the codeword during a read operation, the details of which are discussed below with reference to FIG. 8B in the next section describing the EDAC circuitry 184.

ERROR DETECTION AND CORRECTION

The read channel of the present invention shown in FIG. 6 implements a byte-oriented error correction code (ECC) in an error detection and correction circuit (EDAC) 184 for correcting errors in the estimated data sequence 37 output by the RLL/timing decoder 182. In a byte-oriented EDAC system, such as Reed-Solomon code, the data is processed mathematically in order to generate redundancy symbols which are appended to the data to form a codeword written to the disc. These redundancy symbols are then used upon readback to detect and correct errors in the estimated decoded data sequence 37.

Figure 9A:
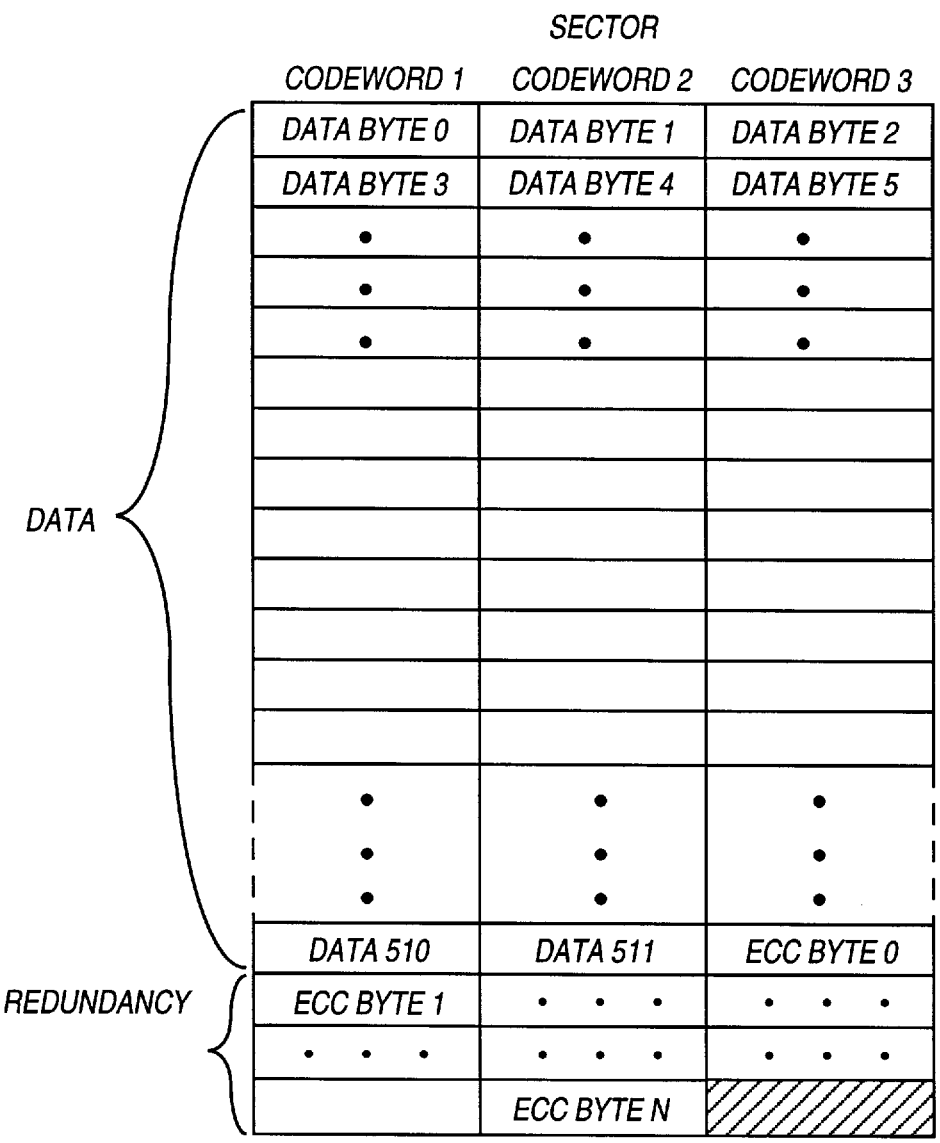
FIG. 9A illustrates a sector of data recorded on the magnetic disc in the form of three interleaved ECC codewords.

Referring again to FIG. 2A and 2B, each sector 15 in a track 13 may represent a single ECC codeword; that is, the data field 72 of a sector would contain user data and redundancy symbols appended to the end of the user data. However, the most common errors that occur in magnetic recording systems are burst errors that typically span two or more consecutive bytes. It is well known that by interleaving the data in a sector to form multiple codewords improves the performance of the EDAC circuit 184 because a burst error is spread across multiple codewords rather than effecting a single codeword. This is illustrated in FIG. 9A which shows a typical 512 byte sector divided into three interleaved codewords. Data byte 0 is the first byte of codeword 1 and data byte 3 is the second byte. Data byte 1 is the first byte of codeword 2 and data byte 4 is the second byte, etc. If a burst error begins in data byte 3 and ends in data byte 5, then only one byte per codeword will be in error rather than three bytes in one codeword as in a non-interleaved system. In the present invention, the EDAC circuit 184 is preferably implemented as a three-interleave Reed-Solomon error correction code, an example of which is disclosed in U.S. Pat. No. 5,446,743 which is assigned to the same entity as the present invention.

Another aspect of prior art read channels relevant to correcting errors using an interleaved, byte-oriented code is the RLL encoder 6 and RLL decoder 36 (ENDEC) shown in FIG. 1. Typically, the code rate of a conventional ENDEC is selected so that each bit error in the detected data sequence will affect only one byte in the decoded output sequence. For example, the above referenced U.S. Pat. No. 5,422,760 discloses an 8/9 ENDEC which decodes each 9-bit codeword into an 8-bit data byte, thereby limiting bit error propagation from a 9-bit error to one or two bytes in the decoded output sequence. A drawback related to the conventional 8/9 ENDEC, however, is the decrease in storage capacity due to the overhead associated with lower 8/9 rate. If a higher rate conventional ENDEC were implemented, such as rate 16/17, a burst error that spans two codewords will corrupt four bytes in the decoded sequence 37 causing one of the codewords in FIG. 9A to contain two bytes in error. The present invention overcomes this problem by providing a rate 16/17 ENDEC where any burst error spanning 9-bits or less in the detected binary sequence 33 affects at most two bytes in the decoded output sequence 37, and an error of 17 bits or less affects at most three bytes. Thus, each interleaved codeword in FIG. 9A will contain at most one byte in error for any error in the detected binary sequence 33 that spans 17 bits or less.

Figure 8B:
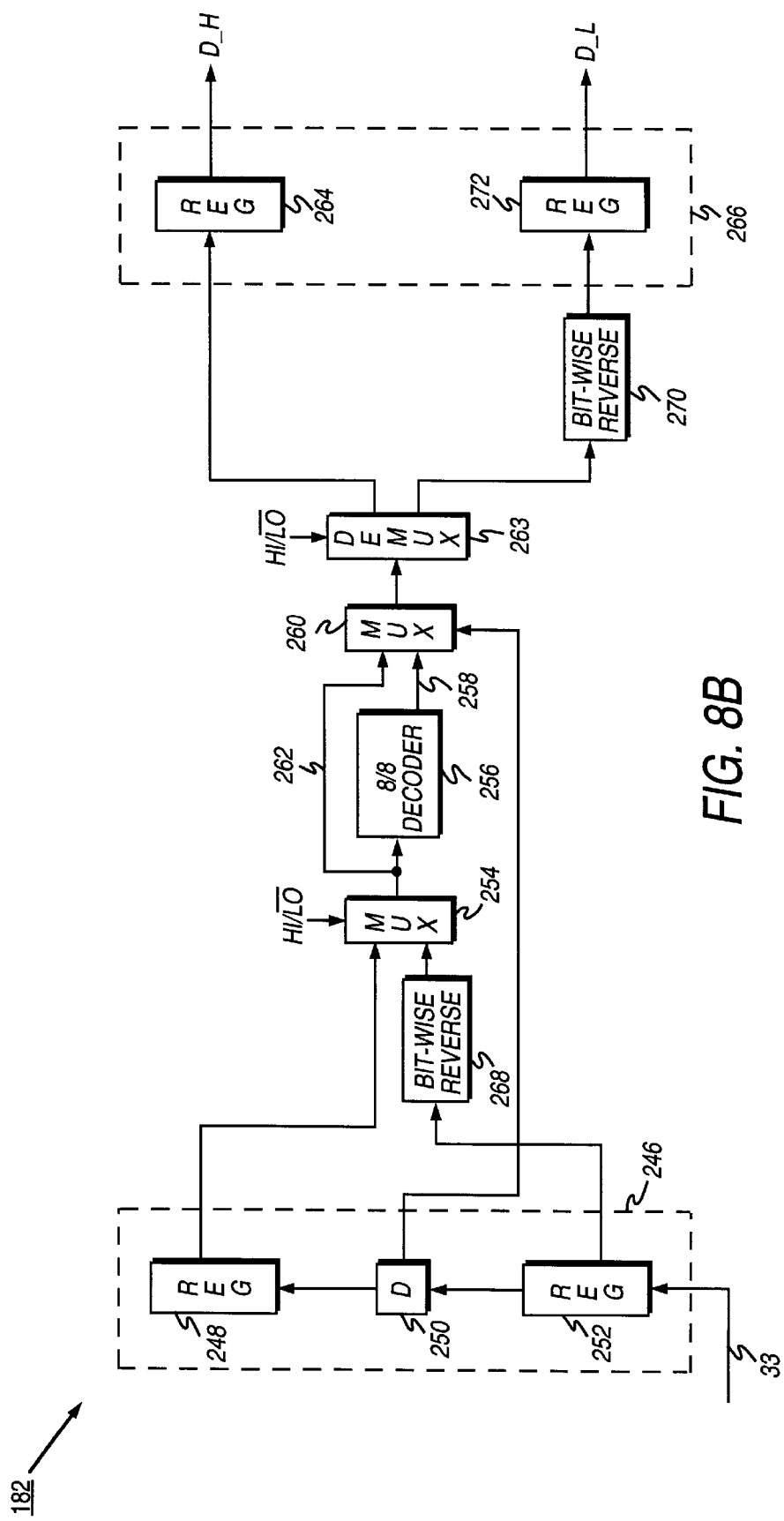
FIG. 8B shows details of a 16/17 decoder which implements the inverse operation of the encoder in FIG. 8A in decoding the detected NRZI data sequence into an estimated user data sequence.

This is accomplished according to the present invention by decoding the first eight bits of the codeword independent from the last eight bits. The decoder 182 of the present invention is shown in FIG. 8B. The estimated NRZI sequence ^b(n) 33 output by the PR4/NRZI converter 180 is shifted serially into a register 246 comprising an 8-bit high byte register 248, a middle bit register 250, and a low byte register 252. Once a complete 17 bit codeword has been shifted into the register 246, the high byte 248 is selected through multiplexer 254 as the input to an 8/8 decoder 256 which outputs a decoded byte 258 according to Table 5. The middle bit 250 selects, through multiplexer 260, the decoded byte 258 or the high byte 262 depending on whether or not the received codeword was encoded by the 8/8 RLL/timing encoder 170 of FIG. 8A. The output of multiplexer 260 is routed through a de-multiplexer 263 and stored in the high byte 264 of a 16 bit register 266. The low byte 252 of the codeword is then bit-wise reversed 268, routed through multiplexer 254, and mapped by the 8/8 decoder 256 according to Table 5 (i.e., the same decoder is used to decode the high byte 248 and the low byte 252 of the codeword which reduces the cost and complexity of the circuit). The middle bit 250 selects, through multiplexer 260, the decoded byte 258 or the low byte 262 depending on whether or not the received codeword was encoded by the 8/8 RLL/timing encoder 170 of FIG. 8A. The output of multiplexer 260 is routed through a de-multiplexer 262, bit-wise reversed 270, and stored in the low byte 272 of the 16 bit register 266.

From the above description, it should be apparent that the decoder 182 of the present invention decodes a 17 bit codeword in a high and low byte order, independent from each other. That is, unlike the prior art, the present invention will correctly decode the high byte of the codeword if there is an error in the low byte, and vise versa. Consequently, an error that starts in the first bit of a codeword and extends through the first byte of the second codeword (i.e., 25 bits long) will only affect three bytes in the decoded output. Furthermore, any error that spans 17 bits or less will only affect three consecutive decoded bytes because a 17-bit error can affect, at most, only one middle bit. Therefore, any error that spans 17 bits or less will corrupt only one byte in each codeword in the three interleaves shown in FIG. 9A.

Figure 9B:
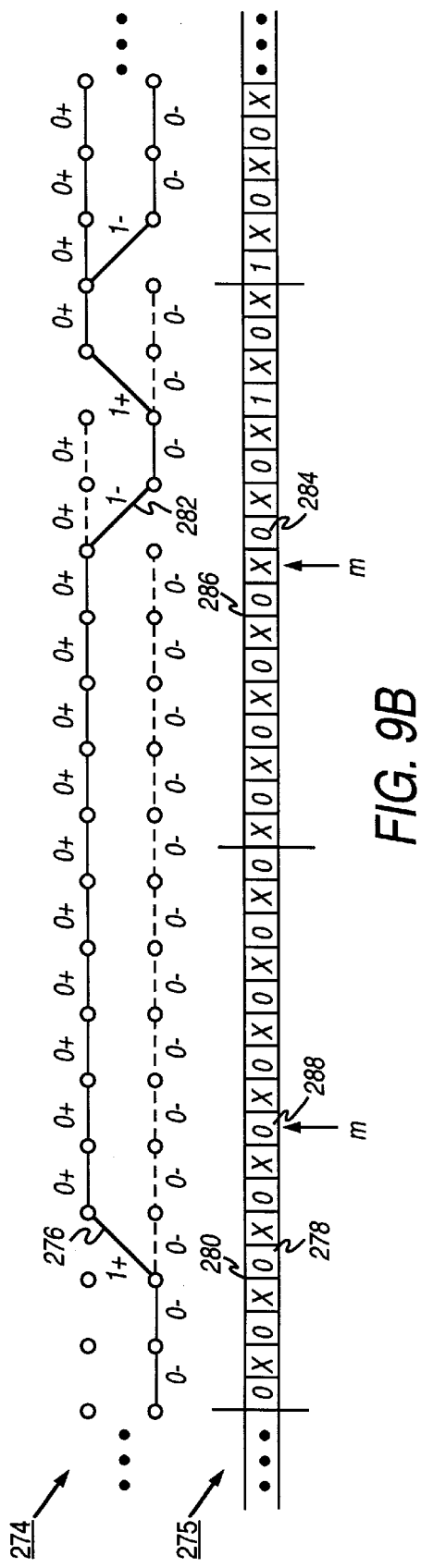
FIG. 9B demonstrates how a minimum distance PR4 error event may span the middle bit of two consecutive codewords, thereby corrupting four bytes in the decoded output sequence.

It is possible that a minimum distance error event in the PR4 sequence detector 34 of FIG. 6 will extend beyond 17 bits, thereby corrupting two middle bits of consecutive codewords and causing four bytes in error in the decoded output. This is illustrated in FIG. 9B which shows the trellis diagram 274 for a detected sequence in one interleave and the corresponding codeword 275 recorded on the disc. In this example sequence, channel noise has caused the sequence detector to detect a false positive transition 276 at the 5th bit 278 of the first codeword 280, and to detect a negative transition 282 at the 10th bit 284 of the following codeword 286. As a result, the erroneous sequence output by the PR4 sequence detector 34 is . . . 1+,0+,0+,0+,0+,0+,0+ ,0+,0+,0+,0+,1– . . . rather than the correct sequence of . . . 0–,0–,0–,0–,0–,0–,0–,0–,0–,0–,0–,0– . . . . Even though the magnitude of the middle bit 288 of the first codeword 280 will be correctly detected as a "0", the sign bit will be incorrectly detected as "+" and the PR4/NRZI converter 180 will output the incorrect value. Thus, both bytes of the first codeword 280 will be erroneously decoded. Similarly, since the sign bits of the first byte of the second codeword 286 are in error, they too will be decoded erroneously by the PR4/NRZI converter 180. Finally, the second byte of the second codeword 286 will be decoded erroneously because of the false negative transition 282 in the first bit 284 detected as a "1–" instead of the correct value, "0–". It is, therefore, an aspect of the present invention to prevent a minimum distance error event in the PR4 sequence detector from spanning the middle bit of two consecutive codewords, thereby constraining the length of the error event to three consecutive codeword bytes.

Figure 9C:
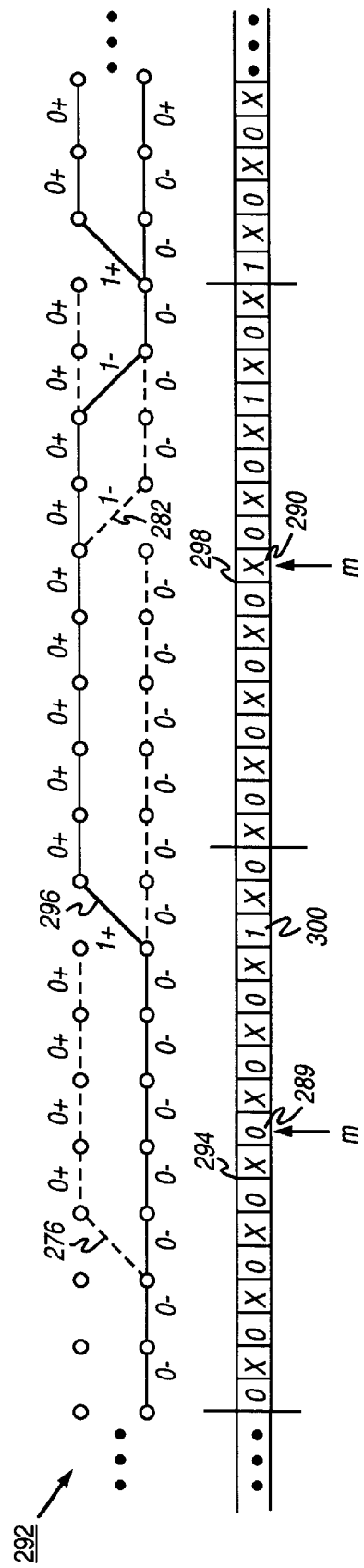
FIG. 9C shows a coding constraint of the present invention which prevents the error propagation of FIG. 9B.

The present invention constrains the length of a minimum distance error event in the PR4 detector to three codeword bytes by encoding the input sequence such that a non-zero sample value will be detected in both the even and odd interleaves within every sequence of 17 bits, beginning with the bit following the middle bit 289 of a 17 bit codeword and ending with the middle bit 290 of the following codeword. This is illustrated in FIG. 9C which shows the trellis diagram 292 for the same codeword sequence as in FIG. 9B except that a "1" bit 300 has been encoded into the second byte of the first codeword 294. In this manner, a non-zero sample value 296 is detected in the read signal sample values within a span starting with the first bit after the middle bit 289 of the first codeword 294 and ending with the middle bit 290 of the second codeword 298. As can be seen, this prevents the minimum distance error event caused by the positive noise sample 276 from spanning two consecutive middle bits (assuming that the noise sample 276 is smaller in amplitude than the signal sample 296 generated by the "1" bit 300 in the first codeword 294, which is likely to occur).

Thus, as described above, the encoder 170 of FIG. 8A comprises an RL-detector 224 which evaluates the high byte 228 of the current codeword 188, the prepended low byte 198 of the previous codeword 226, and the mapped codeword 214. If the above constraints are not satisfied, then the RL-detector 224 either forces the codeword to be mapped or inhibits the mapping (via FORCE MAP 220 or INHIBIT 222 signals) as described above.

Thus, by decoding the high byte and low byte of each codeword independent from one another, and by preventing a minimum distance error event in the PR4 detector from spanning the middle bit of two consecutive codewords, an error event of length 17 bits or less will corrupt, at most, three consecutive codeword bytes. That is, for the three interleave system of FIG. 9A, a burst error event of 17 bits or less will corrupt only one byte in each codeword. In this manner, the present invention implements an efficient rate 16/17 ENDEC without propagating errors across four codeword bytes as would happen in a prior art 16/17 ENDEC.

The aspects of the invention have been fully realized through the embodiments disclosed herein. Those skilled in the art will appreciate that the various aspects of the invention can be achieved through different embodiments without departing from the essential function. For instance, the encoder 170 shown in FIG. 8A and the decoder 182 shown in FIG. 8B could be implemented using combinatorial logic or using a lookup table. These, and other like modifications are obvious and merely a matter of design choice in light of the teachings disclosed herein. The particular embodiments disclosed are illustrative and not meant to limit the scope of the invention as appropriately construed from the following claims.

TABLE 1

| Channel | Transfer Function | Dipulse Response |
|---|---|---|
| PR4 | $(1 - D)(1 + D)$ | 0, 1, 0, -1, 0, 0, 0, ... |
| EPR4 | $(1 - D)(1 + D)^2$ | 0, 1, 1, -1, -1, 0, 0, ... |
| EEPR4 | $(1 - D)(1 + D)^1$ | 0, 1, 2, 0, -2, -1, 0, ... |

TABLE 2

| PR4 Output | | SNRZI | | PR4 Output | | SNRZI | |
|---|---|---|---|---|---|---|---|
| $D_{n-1}$ | $D_n$ | $S_{n-1}$ | $S_n$ | $D_{n-1}$ | $D_n$ | $S_{n-1}$ | $S_n$ |
| +0 | +0 | +0 | +0 | +1 | +0 | +0 | +0 |
| +0 | -1 | +1 | -1 | +1 | +1 | +1 | +0 |
| -0 | -0 | -0 | -0 | +1 | -1 | +0 | -1 |
| -0 | +0 | -1 | +1 | -1 | -0 | -0 | -0 |
| +0 | -1 | +0 | -1 | -1 | +1 | -0 | +1 |
| -0 | +1 | -0 | +1 | -1 | -1 | -1 | -0 |
| +0 | +1 | +1 | +0 | +1 | -0 | +1 | -1 |
| -0 | -1 | -1 | -0 | -1 | +0 | -1 | +1 |

TABLE 3

| ↓ | GRADE | ↓ |
|---|---|---|
| 1001 | 2 | 1001 |
| 0001 | 1 | 1000 |
| 010 | 2 | 010 |
| 1011 | 1 | 1011 |
| 0110 | 2 | 0110 |
| 01110 | 2 | 01110 |
| 011110 | 1 | 011110 |
| 0111110 | 2 | 0111110 |
| 1111110 | 1 | 0111111 |
| 10X | 1 | for bit 16 |
| 011 | 1 | for bits 13–16 |

TABLE 4

| UNMAPPED | MAPPED | UNMAPPED | MAPPED |
|---|---|---|---|
| 00000000 | 01010010 | 10000000 | 10101010 |
| 00000001 | 01001011 | 10000001 | 01010111 |
| 00000010 | 10101101 | 10000010 | 01011110 |
| 00000011 | 01010110 | 10000011 | 01000100 |
| 00000100 | 10101011 | 10000100 | 01011000 |
| 00000101 | 11001000 | 10000101 | 11000110 |
| 00000110 | 10111010 | 10000110 | 01001101 |
| 00000111 | 01001000 | 10000111 | 01010000 |
| 00001000 | 10101000 | 10001000 | 00110101 |

TABLE 4

| UNMAPPED | MAPPED | UNMAPPED | MAPPED |
|---|---|---|---|
| 00001001 | 00100111 | 10001001 | 11111001 |
| 00001010 | 11101000 | 10001010 | 00110111 |
| 00001011 | 10010011 | 10001011 | 10001101 |
| 00001100 | 10101110 | 10001100 | 01000010 |
| 00001101 | 10010001 | 10001101 | 10000010 |
| 00001110 | 10100110 | 10001110 | 00110100 |
| 00001111 | 01001001 | 10001111 | 00100101 |
| 00010000 | 10010110 | 10010000 | 00110010 |
| 00010001 | 00100011 | 10010001 | 11110111 |
| 00010010 | 00100000 | 10010010 | 10000000 |
| 00010011 | 11000101 | 10010011 | 10111100 |
| 00010100 | 11100010 | 10010100 | 00110011 |
| 00010101 | 01100000 | 10010101 | 00111111 |
| 00010110 | 11000100 | 10010110 | 10110000 |
| 00010111 | 11101011 | 10010111 | 00110001 |

TABLE 4-continued

| UNMAPPED | MAPPED | UNMAPPED | MAPPED |
|---|---|---|---|
| 00011000 | 10101001 | 10011000 | 00101110 |
| 00011001 | 10111110 | 10011001 | 10011110 |
| 00011010 | 10111000 | 10011010 | 10011000 |
| 00011011 | 01101001 | 10011011 | 11110101 |
| 00011100 | 10001010 | 10011100 | 00101100 |
| 00011101 | 11011001 | 10011101 | 00011011 |
| 00011110 | 10100010 | 10011110 | 00101001 |
| 00011111 | 01000101 | 10011111 | 01001100 |
| 00100000 | 01110101 | 10100000 | 01000010 |
| 00100001 | 00100001 | 10100001 | 00011001 |
| 00100010 | 00001011 | 10100010 | 11110011 |
| 00100011 | 10100111 | 10100011 | 01111101 |
| 00100100 | 00001000 | 10100100 | 11110001 |
| 00100101 | 11110000 | 10100101 | 00000011 |
| 00100110 | 11010111 | 10100110 | 10001100 |
| 00100111 | 00011101 | 10100111 | 00001101 |
| 00101000 | 11010000 | 10101000 | 10000110 |
| 00101001 | 11100000 | 10101001 | 00000001 |
| 00101010 | 11001111 | 10101010 | 00011111 |
| 00101011 | 00000101 | 10101011 | 11101111 |
| 00101100 | 10100011 | 10101100 | 01110111 |
| 00101101 | 00011000 | 10101101 | 11111110 |
| 00101110 | 00010011 | 10101110 | 00000010 |
| 00101111 | 10001001 | 10101111 | 11110100 |
| 00110000 | 10010101 | 10110000 | 00100010 |
| 00110001 | 10100001 | 10110001 | 01111100 |
| 00110010 | 11001101 | 10110010 | 01111110 |
| 00110011 | 01100101 | 10110011 | 11110010 |
| 00110100 | 10011100 | 10110100 | 01110000 |
| 00110101 | 00000100 | 10110101 | 11111100 |
| 00110110 | 01101101 | 10110110 | 01110011 |
| 00110111 | 10010111 | 10110111 | 01011111 |
| 00111000 | 01110100 | 10111000 | 00010110 |
| 00111001 | 00010001 | 10111001 | 11100111 |
| 00111010 | 00001001 | 10111010 | 11100011 |
| 00111011 | 10010000 | 10111011 | 01000000 |
| 00111100 | 10010100 | 10111100 | 00010010 |
| 00111101 | 01101011 | 10111101 | 01110001 |
| 00111110 | 01110010 | 10111110 | 00001010 |
| 00111111 | 00101010 | 10111111 | 00100100 |
| 01000000 | 01011100 | 11000000 | 01010101 |
| 01000001 | 11111010 | 11000001 | 00111010 |
| 01000010 | 01111011 | 11000010 | 11101110 |
| 01000011 | 10001110 | 11000011 | 11010101 |
| 01000100 | 01111001 | 11000100 | 11101001 |
| 01000101 | 11000000 | 11000101 | 00111110 |
| 01000110 | 11000010 | 11000110 | 11101010 |
| 01000111 | 11110110 | 11000111 | 00101101 |
| 01001000 | 01101111 | 11001000 | 11100101 |
| 01001001 | 00000000 | 11001001 | 11100001 |
| 01001010 | 00001111 | 11001010 | 01111100 |
| 01001011 | 11000111 | 11001011 | 01001111 |
| 01001100 | 10111101 | 11001100 | 11011010 |
| 01001101 | 11000011 | 11001101 | 01000111 |
| 01001110 | 01100111 | 11001110 | 11100100 |
| 01001111 | 10001011 | 11001111 | 11010100 |
| 01010000 | 10110111 | 11010000 | 00101011 |
| 01010001 | 10000000 | 11010001 | 00110000 |
| 01010010 | 00000111 | 11010010 | 11011111 |
| 01010011 | 00001100 | 11010011 | 01000011 |
| 01010100 | 11000001 | 11010100 | 00111000 |
| 01010101 | 11111111 | 11010101 | 11111000 |
| 01010110 | 00000110 | 11010110 | 01000110 |
| 01010111 | 10111111 | 11010111 | 00101111 |
| 01011000 | 10001000 | 11011000 | 11010110 |
| 01011001 | 10011111 | 11011001 | 00001110 |
| 01011010 | 10011111 | 11011010 | 00011100 |
| 01011011 | 01100011 | 11011011 | 11101101 |
| 01011100 | 11101100 | 11011100 | 11011100 |
| 01011101 | 01111111 | 11011101 | 00111100 |
| 01011110 | 10000101 | 11011110 | 10110110 |
| 01011111 | 10110011 | 11011111 | 00101000 |
| 01100000 | 01101010 | 11100000 | 01010100 |
| 01100001 | 10000100 | 11100001 | 00100110 |
| 01100010 | 10110001 | 11100010 | 11010011 |
| 01100011 | 01100100 | 11100011 | 11001010 |
| 01100100 | 10101111 | 11100100 | 11010001 |

TABLE 4-continued

| UNMAPPED | MAPPED | UNMAPPED | MAPPED |
|---|---|---|---|
| 01100101 | 11111101 | 11100101 | 00010111 |
| 01100110 | 01101000 | 11100110 | 10101100 |
| 01100111 | 01111010 | 11100111 | 00010101 |
| 01101000 | 01101100 | 11101000 | 00010100 |
| 01101001 | 10000111 | 11101001 | 00011110 |
| 01101010 | 11111011 | 11101010 | 00010000 |
| 01101011 | 11100110 | 11101011 | 11011011 |
| 01101100 | 01100010 | 11101100 | 10011010 |
| 01101101 | 01100001 | 11101101 | 00111011 |
| 01101110 | 10100000 | 11101110 | 11001110 |
| 01101111 | 01011011 | 11101111 | 10110101 |
| 01110000 | 01010011 | 11110000 | 10100101 |
| 01110001 | 11011110 | 11110001 | 11011111 |
| 01110010 | 00111101 | 11110010 | 11001011 |
| 01110011 | 01100110 | 11110011 | 10110100 |
| 01110100 | 11011000 | 11110100 | 11001001 |
| 01110101 | 10000011 | 11110101 | 00111001 |
| 01110110 | 10011011 | 11110110 | 01110110 |
| 01110111 | 11001100 | 11110111 | 10111011 |
| 01111000 | 01011101 | 11111000 | 10100100 |
| 01111001 | 00110110 | 11111001 | 10111001 |
| 01111010 | 00011010 | 11111010 | 10011101 |
| 01111011 | 01011011 | 11111011 | 10110010 |
| 01111100 | 01010001 | 11111100 | 10010010 |
| 01111101 | 10011001 | 11111101 | 01101110 |
| 01111110 | 01001110 | 11111110 | 01011010 |
| 01111111 | 11010010 | 11111111 | 01001010 |

TABLE 5

| MAPPED | UNMAPPED | MAPPED | UNMAPPED |
|---|---|---|---|
| 00000000 | 01001001 | 10000000 | 01010001 |
| 00000001 | 10101001 | 10000001 | 10010010 |
| 00000010 | 10101110 | 10000010 | 10001101 |
| 00000011 | 10100101 | 10000011 | 01110101 |
| 00000100 | 00110101 | 10000100 | 01100001 |
| 00000101 | 00101011 | 10000101 | 01011110 |
| 00000110 | 01010110 | 10000110 | 10101000 |
| 00000111 | 01010010 | 10000111 | 01101001 |
| 00001000 | 00100100 | 10001000 | 01011000 |
| 00001001 | 00111010 | 10001001 | 00101111 |
| 00001010 | 10011110 | 10001010 | 00011110 |
| 00001011 | 00100010 | 10001011 | 01001111 |
| 00001100 | 01010011 | 10001100 | 10100110 |
| 00001101 | 10100111 | 10001101 | 10001011 |
| 00001110 | 11011001 | 10001110 | 01000011 |
| 00001111 | 01001010 | 10001111 | 01011010 |
| 00010000 | 11101010 | 10010000 | 00111011 |
| 00010001 | 00111001 | 10010001 | 00001101 |
| 00010010 | 10111100 | 10010010 | 11111100 |
| 00010011 | 00101110 | 10010011 | 00001011 |
| 00010100 | 11101000 | 10010100 | 00111100 |
| 00010101 | 11100111 | 10010101 | 00110000 |
| 00010110 | 10111000 | 10010110 | 00010000 |
| 00010111 | 11100101 | 10010111 | 00110110 |
| 00011000 | 00101101 | 10011000 | 10011010 |
| 00011001 | 10100001 | 10011001 | 01111101 |
| 00011010 | 01111010 | 10011010 | 11101100 |
| 00011011 | 10011101 | 10011011 | 01110110 |
| 00011100 | 11011010 | 10011100 | 00110100 |
| 00011101 | 00100111 | 10011101 | 11111010 |
| 00011110 | 11101001 | 10011110 | 10011001 |
| 00011111 | 10101101 | 10011111 | 01011011 |
| 00100000 | 00010010 | 10100000 | 01101110 |
| 00100001 | 00100001 | 10100001 | 00110001 |
| 00100010 | 10110000 | 10100010 | 00011110 |
| 00100011 | 00010001 | 10100011 | 00101100 |
| 00100100 | 10111111 | 10100100 | 11111100 |
| 00100101 | 10001111 | 10100101 | 11110000 |
| 00100110 | 11100001 | 10100110 | 00001110 |
| 00100111 | 00001001 | 10100111 | 00100011 |
| 00101000 | 11011111 | 10101000 | 00001000 |
| 00101001 | 10011110 | 10101001 | 00011000 |
| 00101010 | 00111111 | 10101010 | 10000000 |
| 00101011 | 11010000 | 10101011 | 00000100 |
| 00101100 | 10011100 | 10101100 | 11100110 |
| 00101101 | 11000111 | 10101101 | 00000010 |
| 00101110 | 10011000 | 10101110 | 00001101 |
| 00101111 | 11010111 | 10101111 | 01100100 |
| 00110000 | 11010001 | 10110000 | 10010110 |
| 00110001 | 10010111 | 10110001 | 01100010 |
| 00110010 | 10010010 | 10110010 | 11111110 |
| 00110011 | 10010100 | 10110011 | 01011111 |
| 00110100 | 10001110 | 10110100 | 11110011 |
| 00110101 | 10001000 | 10110101 | 11101111 |
| 00110110 | 01111001 | 10110110 | 11011110 |
| 00110111 | 10001010 | 10110111 | 01010000 |
| 00111000 | 11010100 | 10111000 | 00011010 |
| 00111001 | 11110101 | 10111001 | 11111001 |
| 00111010 | 11000001 | 10111010 | 00000110 |
| 00111011 | 11101101 | 10111011 | 11110111 |
| 00111100 | 11011101 | 10111100 | 10010011 |
| 00111101 | 01110010 | 10111101 | 01001100 |
| 00111110 | 11000101 | 10111110 | 00011001 |
| 00111111 | 10010101 | 10111111 | 01010111 |
| 01000000 | 10111011 | 11000000 | 01000101 |
| 01000001 | 11010110 | 11000001 | 01010100 |
| 01000010 | 10001100 | 11000010 | 01000110 |
| 01000011 | 11010011 | 11000011 | 01001101 |
| 01000100 | 10000011 | 11000100 | 00010110 |
| 01000101 | 00011111 | 11000101 | 00010011 |
| 01000110 | 10100000 | 11000110 | 10000101 |
| 01000111 | 11001101 | 11000111 | 01001011 |
| 01001000 | 00000111 | 11001000 | 00000101 |
| 01001001 | 00001111 | 11001001 | 11110100 |
| 01001010 | 11111111 | 11001010 | 11100011 |
| 01001011 | 00000001 | 11001011 | 11110010 |
| 01001100 | 10011111 | 11001100 | 01110111 |
| 01001101 | 10000110 | 11001101 | 00110010 |
| 01001110 | 01111110 | 11001110 | 11101110 |
| 01001111 | 11001011 | 11001111 | 00101010 |
| 01010000 | 10000111 | 11010000 | 00101000 |
| 01010001 | 01111100 | 11010001 | 11100100 |
| 01010010 | 00000000 | 11010010 | 01111111 |
| 01010011 | 01110000 | 11010011 | 11100000 |
| 01010100 | 11100000 | 11010100 | 11001111 |
| 01010101 | 11000000 | 11010101 | 11000011 |
| 01010110 | 00000011 | 11010110 | 11011000 |
| 01010111 | 10000001 | 11010111 | 00100100 |
| 01011000 | 10000100 | 11011000 | 01110100 |
| 01011001 | 01111011 | 11011001 | 00011101 |
| 01011010 | 11111110 | 11011010 | 11001100 |
| 01011011 | 01101111 | 11011011 | 11101011 |
| 01011100 | 01000000 | 11011100 | 11011110 |
| 01011101 | 01111000 | 11011101 | 11110001 |
| 01011110 | 10000010 | 11011110 | 01110001 |
| 01011111 | 10110111 | 11011111 | 11010010 |
| 01100000 | 00010101 | 11100000 | 00101001 |
| 01100001 | 01101101 | 11100001 | 11001001 |
| 01100010 | 01101100 | 11100010 | 00010100 |
| 01100011 | 01011011 | 11100011 | 10111010 |
| 01100100 | 01100011 | 11100100 | 11001110 |
| 01100101 | 00110011 | 11100101 | 11001000 |
| 01100110 | 01110011 | 11100110 | 01101011 |
| 01100111 | 01001110 | 11100111 | 10111001 |
| 01101000 | 01100110 | 11101000 | 00001010 |
| 01101001 | 00011011 | 11101001 | 11000100 |
| 01101010 | 01100000 | 11101010 | 11000110 |
| 01101011 | 00111101 | 11101011 | 00010111 |
| 01101100 | 01101000 | 11101100 | 01011100 |
| 01101101 | 00110110 | 11101101 | 11011101 |
| 01101110 | 11111101 | 11101110 | 11000010 |
| 01101111 | 01001000 | 11101111 | 10101011 |
| 01110000 | 10110100 | 11110000 | 00100101 |
| 01110001 | 10111101 | 11110001 | 10100100 |
| 01110010 | 00111110 | 11110010 | 10110011 |
| 01110011 | 10110110 | 11110011 | 10100010 |
| 01110100 | 00111000 | 11110100 | 10101111 |
| 01110101 | 00100000 | 11110101 | 10011011 |
| 01110110 | 11110110 | 11110110 | 01000111 |

TABLE 5-continued

| MAPPED | UNMAPPED | MAPPED | UNMAPPED |
|---|---|---|---|
| 01110111 | 10101100 | 11110111 | 10010001 |
| 01111000 | 11001010 | 11111000 | 11010101 |
| 01111001 | 01000100 | 11111001 | 10001001 |
| 01111010 | 01100111 | 11111010 | 01000001 |
| 01111011 | 01000010 | 11111011 | 01101010 |
| 01111100 | 10110001 | 11111100 | 10110101 |
| 01111101 | 10100011 | 11111101 | 01100101 |
| 01111110 | 10110010 | 11111110 | 10101101 |
| 01111111 | 01011101 | 11111111 | 01010101 |

I claim:

1. A m/n ENDEC for decoding a n-bit codeword into a m-bit data word, comprising a decoder for decoding a predetermined first number of bits out of the n-bit codeword into a first symbol of the data word and for decoding a predetermined second number of bits out of the n-bit codeword into a second symbol of the data word, wherein:

(a) the decoder decodes the first symbol of the data word independent from decoding the second symbol of the data word, and the decoder decodes the second symbol of the data word independent from decoding the first symbol of the data word; and (b) errors in decoding the first symbol of the data word do not induce errors in decoding the second symbol of the data word, and errors in decoding the second symbol of the data word do not induce errors in decoding the first symbol of the data word.

2. The m/n ENDEC as recited in claim 1, wherein the decoder operates according to the same decoding logic when decoding the first symbol and the second symbol of the data word.

3. The m/n ENDEC as recited in claim 1, wherein the decoder operates according to Table 5 above.

4. The m/n ENDEC as recited in claim 1, further comprising:

(a) a means for interrogating a mapping bit out of the n-bit codeword; and (b) a means for selectively decoding the first symbol of the data word and the second symbol of the data word in response to the mapping bit.

5. The m/n ENDEC as recited in claim 1, further comprising a bit-wise reverse circuit for bit-wise reversing a predetermined number of the codeword bits before decoding.

6. The m/n ENDEC as recited in claim 1, wherein the decoder decodes 9 bits of the codeword into 8 bits of the data word.

7. The m/n ENDEC as recited in claim 4, wherein n=17 and the mapping bit is a middle bit of the codeword.

8. The m/n ENDEC as recited in claim 7, further comprising a means for encoding the user data such that a non-zero sample value occurs in both interleaves of a received data stream of codewords within k bits.

9. A method for decoding a n-bit codeword into a m-bit data word, comprising the steps of:

(a) first decoding a predetermined first number of bits out of the n-bit codeword into a first symbol of the m-bit data word;

(b) second decoding a predetermined second number of bits out of the n-bit codeword into a second symbol of the data word, wherein the second decoding operates independent from the first decoding such that errors in decoding the first symbol of the data word do not induce errors in decoding the second symbol of the data word.

10. The method as recited in claim 9, wherein the first and second decoding operate according to the same decoding logic.

11. The method as recited in claim 9, wherein the first and second decoding decode 9 bits of the codeword into 8 bits of the data word.

12. The method as recited in claim 9, wherein the first and second decoding operate according to Table 5 above.

13. The method as recited in claim 9, further comprising the steps of:

(a) interrogating a mapping bit out of the n-bit codeword; and (b) selectively decoding the first symbol of the data word and the second symbol of the data word in response the mapping bit.

14. The method as recited in claim 9, further comprising the step of bit-wise reversing a predetermined number of the codeword bits.

15. The method as recited in claim 13, wherein n=17 and the mapping bit is a middle bit of the 17 bit codeword.

16. The method as recited in claim 15, further comprising the step of encoding the user data such that a non-zero sample value occurs in both interleaves of a received data stream of codewords within k bits.

* * * * *

UNITED STATES PATENT AND TRADEMARK OFFICE
CERTIFICATE OF CORRECTION

PATENT NO. : 5,844,507
DATED : December 1, 1998
INVENTOR(S) : Zook

It is certified that error appears in the above-indentified patent and that said Letters Patent is hereby corrected as shown below:

In col. 13, lines 23-37, Table 3 should read:

Table 3

| ↓ | GRADE | ↓ |
|---|---|---|
| 1001 | 2 | 1001 |
| 0001 | 1 | 1000 |
| 010 | 2 | 010 |
| 1011 | 1 | 1101 |
| 0110 | 2 | 0110 |
| 01110 | 2 | 01110 |
| 011110 | 1 | 011110 |
| 0111110 | 2 | 0111110 |
| 1111110 | 1 | 0111111 |
| 10X | 1 | for bit 16 |
| 011 | 1 | for bits 13-16 |

Signed and Sealed this

Ninth Day of November, 1999

Attest:

Attesting Officer

Q. TODD DICKINSON

Acting Commissioner of Patents and Trademarks